United States Patent [19]

Webb

[11] 4,383,267
[45] May 10, 1983

[54] AVALANCHE PHOTODIODE AND METHOD OF MAKING SAME

[75] Inventor: Paul P. Webb, Quebec, Canada

[73] Assignee: RCA Corporation, New York, N.Y.

[21] Appl. No.: 198,209

[22] Filed: Oct. 17, 1980

[51] Int. Cl.³ .................. H01L 27/14; H01L 29/90
[52] U.S. Cl. .................................. 357/30; 357/13
[58] Field of Search ............................ 357/30, 13

[56] References Cited

U.S. PATENT DOCUMENTS 4,079,405  3/1978  Ohuchi et al. ................. 357/30 X
4,129,878 12/1978  Webb ............................. 357/30 X

OTHER PUBLICATIONS

L. A. Murray, K. Wang and K. Hesse, "A Review of Avalanche Photodiodes, Trends and Markets", *Optical Spectra*, (Apr. 1980) pp. 54–59.

*Primary Examiner*—Martin H. Edlow
*Assistant Examiner*—J. Carroll
*Attorney, Agent, or Firm*—Birgit E. Morris; Donald S. Cohen

[57] ABSTRACT

The invention is an improved avalanche photodiode having higher sensitivity at short wavelengths and a method of making it. The improvement comprises a contacting layer of varying thickness which can have a thin portion through which light enters the avalanche photodiode and a thicker portion surrounding the thin portion to which electrical contact can be made. This structure exhibits substantially greater sensitivity at wavelengths less than 500 nanometers without affecting the long wavelength sensitivity. The invention is also a method of forming the avalanche photodiode where the thicker portion and the thinner portions are sequentially formed using a two-step diffusion process.

5 Claims, 3 Drawing Figures

AVALANCHE PHOTODIODE AND METHOD OF MAKING SAME

The present invention relates to an avalanche photodiode having improved short wavelength sensitivity and a method of making the same.

BACKGROUND OF THE INVENTION

An avalanche photodiode is a light detector which typically comprises a π-type conductivity substrate having an n-type layer extending into the substrate a distance from a first major surface of the substrate, and a p-type layer extending a further distance into the substrate from the n-type layer, thereby forming a p-n junction between these two layers. A p+-type conductivity contacting layer extends a distance into the substrate from second surface of the substrate to provide a surface layer suitable for electrical contacting. When a reverse bias voltage is applied to the photodiode the depletion region of the diode, i.e., that region having no free electrical charge, reaches through to the π-type substrate region when the peak electric field at the p-n junction is about 5–10% less than that required to cause an avalanche breakdown. A further increase in the applied voltage causes the depletion region to increase rapidly towards the p+ layer, while the electric field throughout the device increases relatively slowly.

Light entering the device through the p+ contacting layer is absorbed creating electrical charge. Electrons created in the π-type region are swept to the high field region where multiplication occurs. The absorption of light at wavelengths greater than about 700 nanometers is relatively low, so that a large fraction of the incident light penetrates through the p+ layer into the π-type layer where the electrons generated can be swept into the multiplication region with only a small loss. At wavelengths less than about 700 nanometers a progressively larger fraction of the incident light is absorbed in the p+ layer where the electrons produced quickly recombine and are lost before they can be swept into the multiplication region. The result is a decrease in the device sensitivity of more than an order of magnitude between 700 nanometers and 400 nanometers wavelengths. To reduce the recombination losses, the thickness of the p+ layer has been reduced. However, photodiodes having a shallow p+ layer consistently exhibit high electrical noise or total failure due to susceptibility of the surface to damage from handling and/or electrical contacting.

Ohuchi et al, in U.S. Pat. No. 4,079,405 issued Mar. 14, 1978, have disclosed a semiconductor photodetector having a reduced variation in sensitivity over a wide range of wavelengths. This reduction was accomplished by reducing the thickness of the active region thereby reducing the longer wavelength sensitivity and by making the p-n junction as close as possible to the surface through which light enters the device so as to increase the sensitivity at shorter wavelengths.

It would be desirable, however, to have an avalanche photodiode in which the short wavelength sensitivity is increased while maintaining the high sensitivity at longer wavelengths.

SUMMARY OF THE INVENTION

The invention is an avalanche photodiode having improved sensitivity at short wavelengths while maintaining the long wavelength sensitivity. This improvement is achieved by means of a contacting layer of varying thickness. The layer is thinner in the portion of the surface through which the photons enter the device while the region surrounding this portion is thicker so that it can be handled and electrical contact made to it without changing the sensitivity or noise characteristics of the photodiode.

The method of making the improved a avalanche photodiode is a double diffusion process which comprises the steps of forming a thin contacting layer in the region where light enters the avalanche photodiode, and forming a thicker contacting layer in the region surrounding the thinner region which is of sufficient thickness to be handled and contacted.

DETAILED DESCRIPTION OF THE INVENTION

Figure 1:
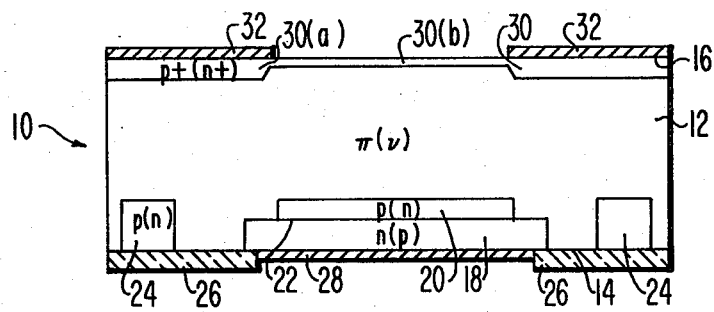
FIG. 1 is a schematic illustration of a cross-sectional view of a first embodiment of the improved avalanche photodiode of the invention.

Referring to FIG. 1, the improved avalanche photodiode 10 comprises a substrate 12 having major surfaces 14 and 16. The substrate 12 is typically of high resistivity material and is of π-type conductivity. An n-type conductivity layer 18 extends a distance into the substrate 12 from the surface 14. A p-type conductivity layer 20 extends a further distance into the substrate 12 from the n-type layer 18, thereby forming a p-n junction at the interface 22 between the p-type layer 20 and the n-type layer 18. A channel stop ring 24 of the same conductivity type as the substrate, here p-type, extends a distance into the substrate around but not contacting the layers 18 and 20. A passivating layer 26 overlies a portion of the major surface 14. An electrically conducting layer 28 overlies a portion of the major surface 14 and provides electrical contact to the n-type conductivity layer 18.

A contacting layer 30 of p+-type conductivity extends a distance into the substrate 12 from the major surface 16. The layer 30 is comprised of two parts. A first part 30(a) extends a distance into the substrate 12 from a portion of the surface 16. The thickness of the first part 30(a) is designed to be thick enough to withstand handling and electrical contacting to the surface 16. A second part 30(b) extends a distance into the substrate 12 from that portion of the major surface 16 through which light enters the photodiode. The thickness of the second part 30(b) is typically much less than that of the first part 30(a). The contacting layer thus forms a continuous layer across the surface 16, but one of varying thickness. An electrical contact 32 overlies a portion of the surface 16 containing the first part 30(a) of the contacting layer 30.

Figure 2:
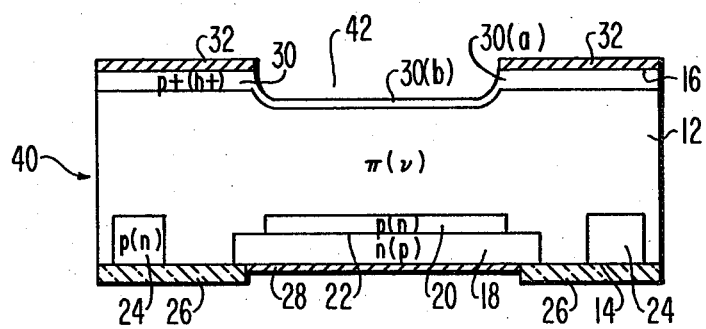
FIG. 2 is a schematic illustration of a cross-sectional view of a second embodiment of the improved avalanche photodiode of the invention.

Referring to FIG. 2, the elements of the improved avalanche photodiode 40 have the same numerical identification as the elements of the photodiode 10 shown in FIG. 1. The photodiode 40 of FIG. 2 differs from the photodiode 10 of FIG. 1 in that the second major surface 16 of the substrate 12 has a well 42 therein extending a distance down into the substrate 12 in the region of the surface 16 through which light enters the the avalanche photodiode. The well 42 extends a distance into the second major surface 16 greater than the thickness of the thicker portion 30(a) of the contacting layer 30. The second part 30(b) of the contacting layer 30 extends a distance into the substrate from the surface of the well 42. The contacting layer 30 thus extends a distance into the surface 16 of the substrate 12 which varies between the peripheral first part 30(a) which is relatively thick and the second part 30(b) which is relatively thinner.

The conductivity type of the various layers in the substrate 12 shown in FIGS. 1 and 2 are labelled using the p(n) notation. The conductivity type shown in parentheses after each of these labels corresponds to the device having the inverse conductivity types. That is, the device may be constructed from a substrate having either $\pi$ or $\nu$ conductivity type conductivity. If the substrate is of $\nu$-type conductivity, the conductivity of the other layers correspond to those shown in parentheses.

The substrate 12 is typically of silicon having a resistivity between about 500 and about 10,000 ohm-cm and preferably is about 3,000 ohm-cm.

The n-type conductivity layer 18 typically extends a distance of about 10 micrometers into the substrate 12 from the surface 14 and extends laterally over a portion of the substrate surface 14. This layer is typically formed by drive-in diffusion of a phosphorous dopant from a phosphorous doped oxide overlying a portion of the surface 14.

The p-type conductivity layer 20 extends a further distance of typically about 15 microns into the substrate 12 from the interface 22 with the n-type conductivity layer 18. This layer is typically formed by ion implantation of boron and then a drive-in diffusion. This layer is formed prior to the formation of the n-type conductivity layer 18.

A p-n junction is formed at the interface 22 between the layers 18 and 20 and is the region where the multiplication of charge occurs.

The channel stop ring 24 is of the same type but of higher conductivity than the substrate and is used to reduce surface leakage current. The channel stop ring 24 is typically formed by diffusion techniques and extends into the substrate 12 a distance of about 20 microns from the surface 14.

The passivating layer 26 is of an electrically insulating material, typically silicon dioxide, about 0.5 micrometer thick, which may be formed by standard thermal oxidation techniques. This layer may overlie a portion of the surface 14 and is designed to reduce surface leakage current.

The electrically conducting layer 28 overlies that portion of the major surface 14 contiguous with the n-type conductivity layer 18 and serves as an electrical contact to this region. The conducting layer 28 may also serve as a reflector of light transmitted through the substrate 12 to this interface. Typically the conducting layer 28 is of a metal or a sequence of metal layers which will reflect the incident light.

The contacting layer 30 is comprised of a first part 30(a) and a second part 30(b) of $p^+$-type conductivity. The first part 30(a) is typically between about 0.5 and about 1 micrometer thick and is typically formed by diffusion from a boron nitride source for 30 minutes at about 1,000° C. The second part 30(b) is preferably between about 200 and 1000 Angstroms thick and is typically about 500 Angstroms thick. The second part is formed by diffusion from the boron nitride source for about 30 minutes at about 850° C.

The $p^+$-type layer 30 of the photodiode 10 shown in FIG. 1 is formed by first masking the central portion of the major surface 16 through which light enters the device using about 5,000 Angstroms of $SiO_2$ as a mask. The first part 30(a) of the $p^+$-type layer 30 is then formed to a thickness of between about 0.5 and about 1.0 micrometer. The mask is then removed and a diffusion of the entire surface is made to form a layer about 500 Angstroms thick in the area which was previously masked.

The layer 30 as shown in FIG. 2 is formed by a diffusion into the entire surface 16 of the substrate 12 to form a layer between about 0.5 and about 1.0 micrometer thick. The peripheral portion outside that portion through which light enters the device is then masked, typically using about 5,000 Angstroms of $SiO_2$. The center portion of the surface 16 is then etched using a standard isotropic etch for silicon. The mask is then removed and a second diffusion is performed to form the thin second part 30(b).

The electrical contact 32 is comprised of a metal or a sequence of metals which make electrical contact to the first part 30(a) of the contacting layer 30.

An anti-reflection coating may overlie that portion of the second part 30(b) of the major surface 16 through which light enters the photodiode. The wavelength of the incident light and the optical index of refraction of the constituent materials of this layer will determine its thickness. To enhance the ultraviolet sensitivity of the avalanche photodiode an anti-reflection coating of silicon monoxide having a thickness of $\frac{1}{4}$ wave at about 400 nanometers may be used.

Figure 3:
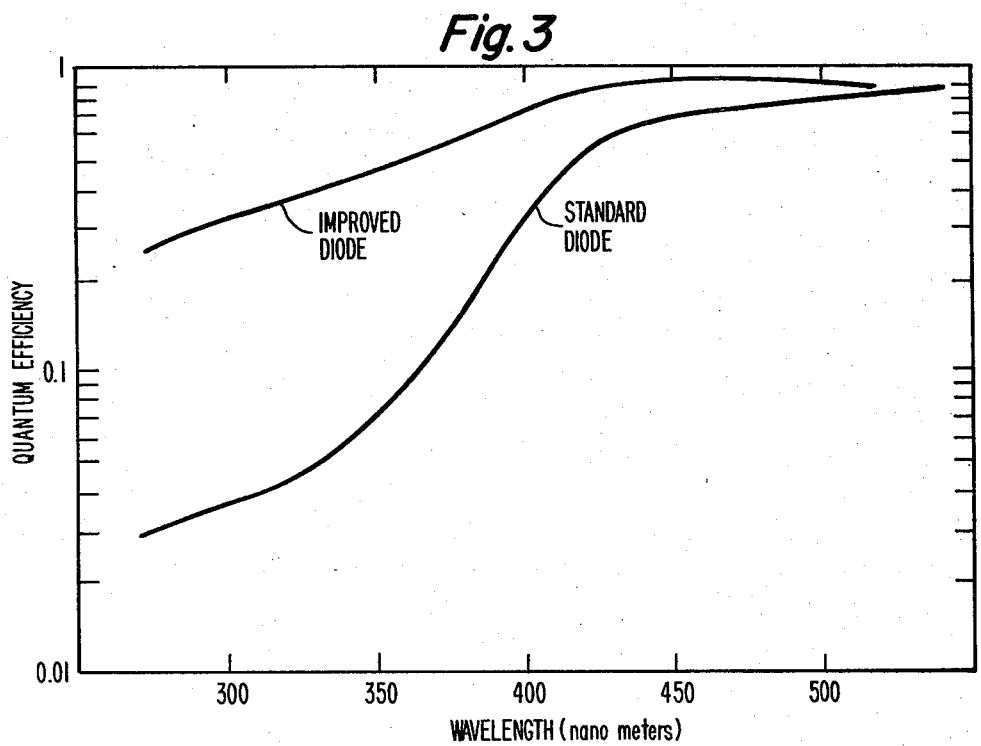
FIG. 3 is a graphical illustration of the quantum efficiency of the photodiode as a function of wavelength showing the enhanced short wavelength response.

In FIG. 3 the quantum efficiency, the ratio of the number of electrons generated by the absorption process to the number of photons of a particular wavelength incident on the photodiode, is plotted as a function of the wavelength of the incident light for a standard avalanche photodiode and an improved avalanche photodiode of the type shown in FIG. 1. These spectral response curves show that for wavelengths shorter than about 400 nanometers a large improvement in quantum efficiency occurs, including approximately a factor of 8 improvement at the shortest wavelength measured, about 254 nanometers. It is further to be seen from FIG. 3 that the high quantum efficiency of the standard device at wavelengths greater than 500 nanometers is not adversely effected by the changes in the device to improve the short wavelength sensitivity. Furthermore, the quantum efficiencies typically are five to ten times greater than those of the device described by Ohuchi et al while the quantum efficiency variation is only about a factor of 5 in the wavelength range from approximately 254 to about 1,060 nanometers. This improvement occurs because the dead space occupied by the contacting layer at the surface through which light enters the avalanche photodiode has been reduced by about a factor of 10 without changing any other elements of the photodiode. A large fraction of the short wavelength light entering the photodiode can then reach the high sensitivity $\pi$-type region before being absorbed and electrons so generated can thus be swept into the multiplication region.

I claim:
1. In an avalanche photodiode comprising:
   a semiconductor substrate having opposed major surfaces;

a first layer in the substrate and adjoining a first major surface of the substrate;

a second layer in the substrate spaced a distance from the first major surface and contiguous with a portion of the first layer; and a contacting layer in the substrate and adjoining a second major surface of the substrate through which light enters the photodiode;

wherein the substrate, the second layer and the contacting layer are of one conductivity type and the first layer is of the opposite conductivity type thereby forming a p-n junction between the first and second layers;

the improvement which comprises:

the contacting layer being of varying thickness with the portion of the contacting layer through which light enters the photodiode being thinner than the remaining portion.

2. An avalanche photodiode according to claim 1 wherein the substrate is high resitivity $\pi$-type conductivity silicon, the second layer and the contacting layer are of p-type conductivity and the first layer is of n-type conductivity.

3. An avalanche photodiode according to claim 2 wherein the thin portion of the contacting layer is less than 1000 Angstroms thick.

4. An avalanche photodiode according to claim 3 further comprising an electrically conducting layer overlying a portion of the contacting layer and an electrically conducting layer overlying a portion of the first layer whereby electrical contact is made to the avalanche photodiode.

5. An avalanche photodiode according to claim 3 wherein the thin portion of the contacting layer extends a distance into the substrate from the surface of a well in the second major surface; wherein the well extends a distance into the second major surface greater than the thickness of the thicker portion of the contacting layer in that region of the second major surface where light enters the photodiode.

* * * * *

UNITED STATES PATENT AND TRADEMARK OFFICE
CERTIFICATE OF CORRECTION

PATENT NO. : 4,383,267
DATED : May 10, 1983
INVENTOR(S) : Paul Perry Webb

It is certified that error appears in the above-identified patent and that said Letters Patent is hereby corrected as shown below:

Column 5, claim 2, line 2, "resitivity" should read --resistivity--.
Column 6, claim 4, line 1, "claim 3" should read --claim 2--.
Column 6, claim 5, line 1, "claim 3" should read --claim 2--.

Signed and Sealed this

Twelfth Day of July 1983

[SEAL]

Attest:

GERALD J. MOSSINGHOFF

Attesting Officer

Commissioner of Patents and Trademarks